(12) United States Patent
Haneda

(10) Patent No.: US 12,483,263 B2
(45) Date of Patent: Nov. 25, 2025

(54) COMPARISON CIRCUIT, ANALOG-TO-DIGITAL CONVERTER CIRCUIT, AND SEMICONDUCTOR INTEGRATED CIRCUIT

(71) Applicant: Socionext Inc., Kanagawa (JP)

(72) Inventor: Hidetaka Haneda, Kanagawa (JP)

(73) Assignee: SOCIONEXT INC., Yokohama (JP)

( * ) Notice: Subject to any disclaimer, the term of this patent is extended or adjusted under 35 U.S.C. 154(b) by 172 days.

(21) Appl. No.: 18/473,823

(22) Filed: Sep. 25, 2023

(65) Prior Publication Data

US 2024/0120936 A1   Apr. 11, 2024

(30) Foreign Application Priority Data

Oct. 6, 2022   (JP) .................... 2022-161652

(51) Int. Cl.
H03M 1/46   (2006.01)

(52) U.S. Cl.
CPC ........... *H03M 1/462* (2013.01); *H03M 1/466* (2013.01)

(58) Field of Classification Search
CPC ............................. H03M 1/462; H03M 1/466
See application file for complete search history.

(56) References Cited

U.S. PATENT DOCUMENTS

| | | | | |
|---|---|---|---|---|
| 4,553,052 A | * | 11/1985 | Takahashi | H03K 17/16 327/91 |
| 4,883,987 A | * | 11/1989 | Fattaruso | H03F 1/303 327/50 |
| 5,262,779 A | * | 11/1993 | Sauer | H03K 5/249 341/161 |
| 5,321,402 A | * | 6/1994 | Matsuzawa | H03M 1/165 330/252 |
| 5,889,419 A | * | 3/1999 | Fischer | H03K 5/2481 327/563 |

(Continued)

FOREIGN PATENT DOCUMENTS

| | | | | |
|---|---|---|---|---|
| CN | 1661918 A | * | 8/2005 | .......... H03K 5/1565 |
| CN | 106374930 A | * | 2/2017 | .......... H03M 1/1009 |

(Continued)

*Primary Examiner* — Chico A Foxx
(74) *Attorney, Agent, or Firm* — Rimon P.C.

(57) ABSTRACT

In an AD converter circuit, a comparison circuit includes: a differential comparison circuit configured to perform comparison determination of differential input signals based on an internal clock signal and generate first differential output signals indicating a determination result; a determination assist circuit configured to receive the first differential output signals and generate second differential output signals; a latch circuit configured to hold the second differential output signals and generate third differential output signals; and a clock generation circuit configured to generate the internal clock signal based on the third differential output signals. The determination assist circuit varies a value of the first differential output signals and generate the second differential output signals when a designed time has elapsed with values of the first differential output signals being unvaried from a reset value since the start of an operation of the comparison determination in the differential comparison circuit.

19 Claims, 6 Drawing Sheets

(56) References Cited

U.S. PATENT DOCUMENTS

| | | | | |
|---|---|---|---|---|
| 5,990,737 A * | 11/1999 | Czarnul | ............... | H03F 3/45475 330/69 |
| 6,828,927 B1 * | 12/2004 | Hurrell | ................ | H03M 1/145 341/172 |
| 7,109,797 B1 * | 9/2006 | Turvey | ..................... | H03F 3/45 330/258 |
| 7,551,116 B2 * | 6/2009 | Tomisawa | ............ | H03K 5/2481 341/172 |
| 8,456,340 B2 * | 6/2013 | Kapusta | ................ | H03M 1/125 341/120 |
| 9,019,137 B1 * | 4/2015 | Waltari | ............... | H03M 1/1245 341/150 |
| 9,621,179 B1 * | 4/2017 | Maulik | ............... | H03M 1/0863 |
| 9,893,740 B1 * | 2/2018 | Ramakrishnan | .... | H03M 1/1009 |
| 10,693,486 B1 * | 6/2020 | Ko | ........................ | H03K 5/2481 |
| 2009/0160510 A1 * | 6/2009 | Song | ..................... | H03L 7/0893 327/534 |
| 2011/0063147 A1 * | 3/2011 | Yoshioka | ............... | H03M 1/462 341/118 |
| 2013/0069807 A1 * | 3/2013 | Sestok | ................... | H03M 7/00 341/110 |
| 2013/0099953 A1 * | 4/2013 | Tsai | ..................... | H03M 1/462 341/161 |
| 2014/0022105 A1 * | 1/2014 | Chen | ................... | H03M 1/0682 341/161 |
| 2014/0118174 A1 * | 5/2014 | Arai | ........................ | H03M 1/46 341/155 |
| 2015/0263756 A1 * | 9/2015 | Chiu | ....................... | H03M 1/08 341/172 |
| 2018/0069513 A1 * | 3/2018 | Kumar | ................ | H03F 3/45941 |
| 2021/0297774 A1 * | 9/2021 | Hu | .......................... | H03M 1/66 |

FOREIGN PATENT DOCUMENTS

| | | | | |
|---|---|---|---|---|
| JP | H06164399 A | * | 6/1994 | |
| JP | H07297720 A | * | 11/1995 | |
| JP | H11214963 A | * | 8/1999 | |
| JP | 2001007664 A | * | 1/2001 | |
| JP | 2001195884 A | * | 7/2001 | .......... G11C 7/1066 |
| JP | 2013153246 A | * | 8/2013 | |
| JP | 2016-046758 A | | 4/2016 | |
| JP | 2018170700 A | * | 11/2018 | |
| JP | 7205338 B2 | * | 1/2023 | ............... G04C 3/00 |
| KR | 20240117196 A | * | 8/2024 | |
| WO | WO-2014072391 A1 | * | 5/2014 | .......... H03M 1/1019 |
| WO | WO-2022044588 A1 | * | 3/2022 | .......... H03M 1/0604 |
| WO | WO-2022085324 A1 | * | 4/2022 | |

* cited by examiner

F I G. 1
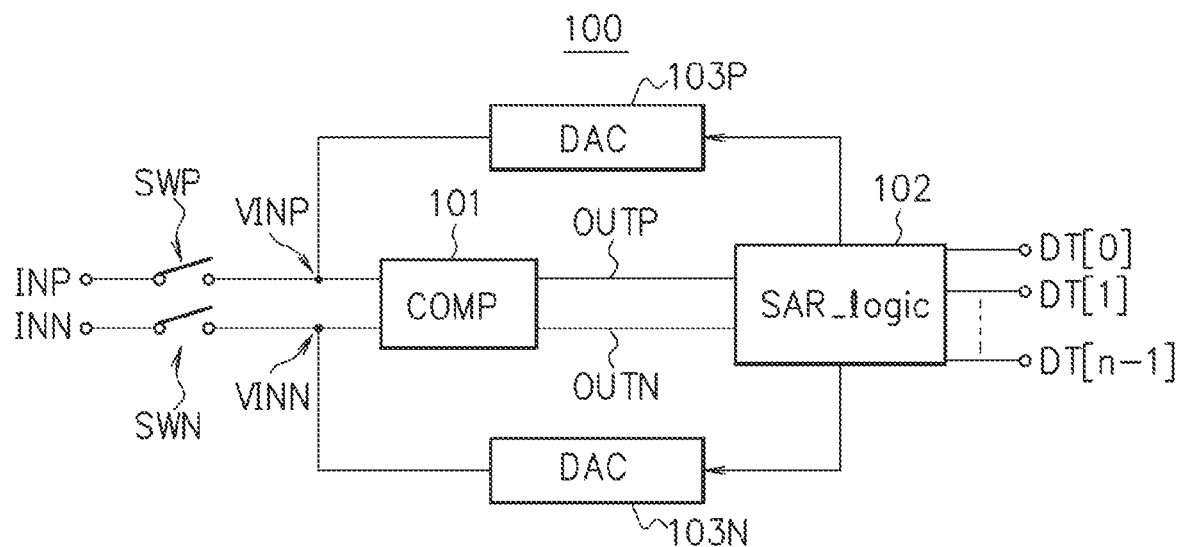
F I G. 2
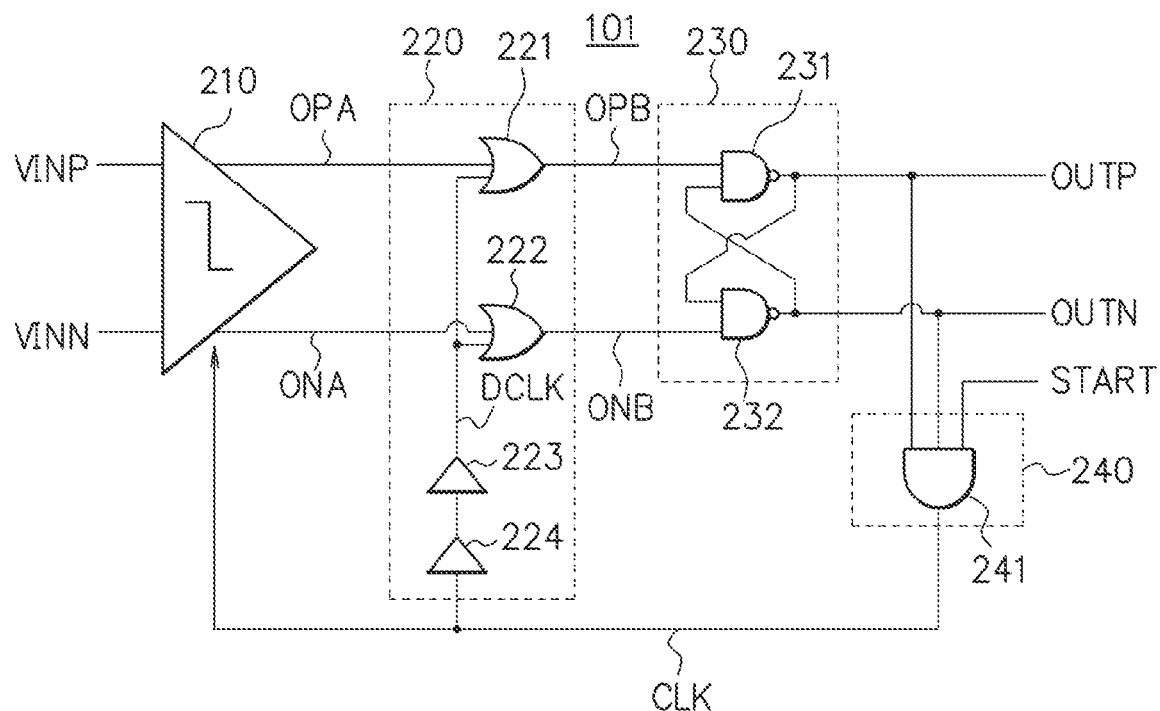

COMPARISON CIRCUIT, ANALOG-TO-DIGITAL CONVERTER CIRCUIT, AND SEMICONDUCTOR INTEGRATED CIRCUIT

CROSS-REFERENCE TO RELATED APPLICATION

This application is based upon and claims the benefit of priority of the prior Japanese Patent Application No. 2022-161652, filed on Oct. 6, 2022, the entire contents of which are incorporated herein by reference.

FIELD

The embodiments discussed herein are directed to a comparison circuit, an analog-to-digital converter circuit, and a semiconductor integrated circuit.

BACKGROUND

A comparison circuit using a dynamic comparator is used in a successive approximation register (SAR) type analog-to-digital (AD) converter circuit that converts an input analog voltage into a digital value. The dynamic comparator is a comparator that operates in synchronization with a clock signal. The dynamic comparator enters a reset state when the clock signal is at one of a low level and a high level, and performs comparison determination of analog voltages when the clock signal is at the other level.

FIG. 10A is a diagram illustrating a configuration example of the comparison circuit using the dynamic comparator. A comparison circuit 1000 illustrated in FIG. 10A is an asynchronous type comparison circuit that performs comparison determination in synchronization with an internally generated clock signal. A dynamic comparator (to be also simply referred to as a "comparator" below) 1010 operates in synchronization with a clock signal CLK. In the example illustrated in FIG. 10A, in the comparator 1010, output signals OPA and ONA are both reset to "0" (a low level) when the clock signal CLK is at a low level, and when the clock signal CLK goes to a high level, one of the output signals OPA and ONA becomes "1" (goes to a high level) according to the result of comparison determination of analog voltages VINP and VINN.

A latch circuit 1020 is composed of two negative logical product operation circuits (NAND circuits) 1021 and 1022 and latches the output signals OPA and ONA of the comparator 1010. Output signals OUTP and OUTN of the latch circuit 1020 are output as output signals of the comparison circuit 1000. A logical product operation circuit (AND circuit) 1030 receives the output signals OUTP and OUTN of the latch circuit 1020 and a control signal START, and outputs the operation result of the signals OUTP, OUTN, and START as the clock signal CLK. The control signal START is set to a low level in a sampling period in an AD conversion operation, and is set to a high level in a comparison period in the AD conversion operation.

FIG. 10B is a view illustrating an example of the operation of the comparison circuit 1000 illustrated in FIG. 10A applied to the SAR type AD converter circuit. At a time T41, the control signal START goes to a high level, and the comparison period in the AD conversion operation is started. Before the comparison period in the AD conversion operation is started, the control signal START is at a low level, and the clock signal CLK output from the AND circuit 1030 is also maintained at a low level. Therefore, before the comparison period in the AD conversion operation is started, the output signals OPA and ONA of the comparator 1010 are both reset to "0" (a low level) regardless of the analog voltages VINP and VINN, and the output signals OUTP and OUTN of the latch circuit 1020, which are output signals of the comparison circuit 1000, are both "1" (a high level).

When the control signal START goes to a high level at the time T41, at a time T42, the clock signal CLK output from the AND circuit 1030 goes to a high level. When the clock signal CLK goes to a high level at the time T42, a comparison determination operation of the analog voltages VINP and VINN, which is for determining the value of the most significant bit (MSB) of the digital value, is started. As in the example illustrated in FIG. 10B, when the analog voltage VINP is higher than the analog voltage VINN and the output signal OPA of the comparator 1010 becomes "1" (goes to a high level) according to the result of the comparison determination, the output signal OPA is latched by the latch circuit 1020 and the output signal OUTP of the latch circuit 1020 becomes "0" (goes to a low level).

The output signal OUTP of the latch circuit 1020 becomes "0" (goes to a low level), and thereby the clock signal CLK goes to a low level at a time T43 assuming that the comparison determination is completed (the result of the comparison determination is obtained). As a result, the output signals OPA and ONA of the comparator 1010 are both reset to "0" (a low level), and the output signals OUTP and OUTN of the latch circuit 1020 both become "1" (go to a high level). The output signals OUTP and OUTN of the latch circuit 1020 both become "1" (go to a high level), and thereby the clock signal CLK goes to a high level at a time 144 and a comparison determination operation of the analog voltages VINP and VINN, which is for determining the value of the second bit from the high-order side of the digital value, is started. The comparison circuit 1000 performs the comparison determination based on the internally generated clock signal CLK, and repeatedly starts the operation for the next bit when the comparison determination for the target bit is completed and the result is obtained (the value of the bit is determined). In this manner, the comparison circuit 1000 determines the value sequentially from the high-order side of the digital value. Then, at a time T45 when the time specified as the comparison period has elapsed, the control signal START goes to a low level, and the AD conversion operation is finished.

[Patent Document 1] Japanese Laid-open Patent Publication No. 2016-46758
[Patent Document 2] U.S. Pat. No. 9,621,179

In the SAR type AD converter circuit using the comparison circuit described above, when a metastable state of the dynamic comparator occurs in the comparison circuit, a long time is taken until the comparison determination for the target bit is completed and the result is obtained. Thereby, before the values of all the bits of the digital value are determined, the time specified as the comparison period elapses, failing to complete the AD conversion operation, resulting in the inability to obtain a correct AD conversion result.

For example, as illustrated in FIG. 10C, when the control signal START goes to a high level at a time T51, the clock signal CLK goes to a high level at a time T52, and a comparison determination operation of the analog voltages VINP and VINN, which is for determining the value of the MSB of the digital value, is started. When the clock signal CLK goes to a high level again at a time T53, a comparison determination operation of the analog voltages VINP and VINN, which is for determining the value of the second bit from the high-order side of the digital value, is started. At this time, when the difference between the analog voltage VINP and the analog voltage VINN is small and the metastable state of the comparator 1010 occurs, after a long time DLM has elapsed since the start of the comparison determination operation, the output signals OPA and ONA of the comparator 1010 vary according to the result of the comparison determination. Then, at a time T55, the clock signal CLK goes to a high level, and a comparison determination operation of the analog voltages VINP and VINN, which is for determining the value of the third bit from the high-order side of the digital value, is started. As above, when the metastable state of the comparator 1010 occurs and a long time is taken until the comparison determination for the target bit is completed and the result is obtained, the AD conversion operation is not sometimes completed by a time T56 when the time specified as the comparison period has elapsed.

SUMMARY

One aspect of the comparison circuit includes: a differential comparison circuit configured to perform comparison determination of differential input signals based on an internal clock signal and generate first differential output signals indicating a result of the comparison determination; a determination assist circuit configured to receive the first differential output signals and generate second differential output signals; a latch circuit configured to latch the second differential output signals and generate third differential output signals; and a clock generation circuit configured to generate the internal clock signal based on the third differential output signals. The determination assist circuit is configured to vary at least one value of the first differential output signals from a reset value and generate the second differential output signals when a designed time has elapsed with values of the first differential output signals being unvaried from the reset value since the start of an operation of the comparison determination in the differential comparison circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of an analog-to-digital converter circuit in a first embodiment;

FIG. 2 is a diagram illustrating a configuration example of a comparison circuit in the first embodiment;

DESCRIPTION OF EMBODIMENTS

Figure 3:
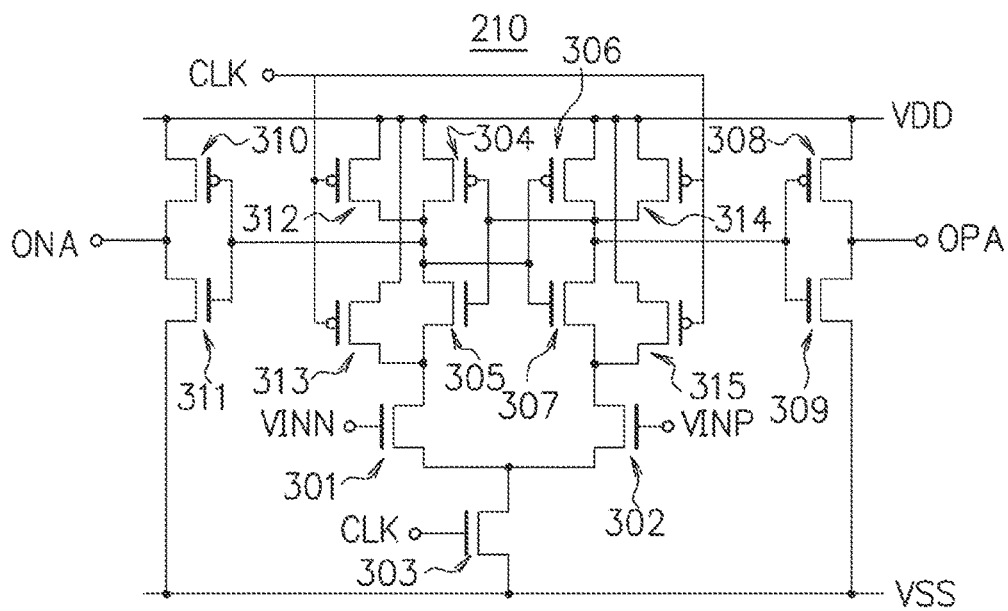
FIG. 3 is a diagram illustrating a configuration example of a dynamic comparator.

There will be explained embodiments below based on the drawings.

First Embodiment

There is explained a first embodiment.

FIG. 1 is a diagram illustrating a configuration example of an analog-to-digital (AD) converter circuit in the first embodiment. The AD converter circuit in this embodiment is, for example, a successive approximation register (SAR) type analog-to-digital (AD) converter circuit. FIG. 1 illustrates, as an example, an n-bit SAR type AD converter circuit, where n is a natural number, that converts an input analog voltage into an n-bit digital value. The SAR type AD converter circuit illustrated in FIG. 1 is an asynchronous type AD converter circuit that performs a comparison operation in synchronization with an internally generated clock signal.

The SAR type AD converter circuit 100 in the first embodiment converts analog voltages input to analog voltage input nodes INP and INN to n-bit digital values and outputs them from output nodes DT[0] to DT[n−1]. In this embodiment, the input of the analog voltage is in a differential input format, and the analog voltage input nodes INP and INN are complementary input nodes. The output node DT[i] is a node from which the i-th bit value of the digital value is output, where i is a subscript and is an integer of i=0 to (n−1) (the same applies hereinafter).

The SAR type AD converter circuit 100 includes switches SWP and SWN, a comparison circuit (COMP) 101, a control circuit (SAR_logic) 102, and digital-to-analog (DA) converter circuits (DAC) 103P and 103N.

The switch SWP has one end thereof connected to the analog voltage input node INP and has the other end thereof connected to a node VINP. The switch SWN has one end thereof connected to the analog voltage input node INN and has the other end thereof connected to a node VINN. The switches SWP and SWN are controlled to be on (closed state, conducting state)/off (open state, non-conducting state) based on a control signal from the control circuit 102.

The comparison circuit 101 performs comparison determination of the voltage of the node VINP and the voltage of the node VINN, and outputs the signals OUTP and OUTN indicating the result of the comparison determination. In this embodiment, the comparison circuit 101 is a comparison circuit using the dynamic comparator that operates in synchronization with a clock signal, and is an asynchronous type comparison circuit that generates (self-excites) a clock signal for operation inside the comparison circuit 101.

The control circuit 102 controls the AD conversion operation in the SAR type AD converter circuit 100. The control circuit 102 controls, according to the control signal to generate, the SAR type AD converter circuit 100 to sample the analog voltages to be input in the sampling period in the AD conversion operation and perform a comparison operation on the analog voltages in the comparison period in the AD conversion operation. For example, the control circuit 102 controls the switches SWP and SWN to be turned on (closed state, conducting state) in the sampling period and turned off (open state, non-conducting state) in the comparison period. Based on the signals OUTP and OUTN output from the comparison circuit 101, the control circuit 102 sequentially determines the value of each bit of the digital value, which is the result of conversion of the analog voltage. The control circuit 102 generates digital codes to be output to the DA converter circuits 103P and 103N, respectively, and outputs them to the DA converter circuits 103P and 103N based on the sequentially determined value of each bit of the digital value.

The DA converter circuits 103P and 103N generate analog voltages corresponding to the respective digital codes output from the control circuit 102. The DA converter circuits 103P and 103N may be configured using a capacitive DA converter circuit, or may be configured using both a capacitive DA converter circuit and a resistive DA converter circuit in combination.

The DA converter circuit 103P is connected to the node VINP, and the DA converter circuit 103N is connected to the node VINN. The voltage of the node VINP becomes the voltage corresponding to the analog voltage generated by the DA converter circuit 103P and the analog voltage input to the analog voltage input node INP and sampled. The voltage of the node VINN becomes the voltage corresponding to the analog voltage generated by the DA converter circuit 103N and the analog voltage input to the analog voltage input node INN and sampled.

There is explained the operation of the SAR type AD converter circuit 100 illustrated in FIG. 1. The SAR type AD converter circuit 100 performs a sampling operation of the analog voltages in the sampling period in the AD conversion operation, and performs a comparison operation on the analog voltages in the comparison period in the AD conversion operation to sequentially determine the value of each bit of the digital value.

In the sampling period in the AD conversion operation, the control circuit 102 controls the switches SWP and SWN to turn them on (closed state, conducting state). Thereby, the analog voltages input to the analog voltage input nodes INP and INN are sampled. After the analog voltages are sampled, the control circuit 102 controls the switches SWP and SWN to turn them off (open state, non-conducting state).

In the comparison period after the sampling period in the AD conversion operation, there is first performed a comparison operation for determining the value of the (n−1)th bit, which is the most significant bit (MSB) of the digital value. At this time, the control circuit 102 outputs to the DA converter circuit 103P an n-bit digital code in which the value of the (n−1)th bit, which is the MSB, is "1" and the values of the (n−2)th bit to the 0th bit, which are the remaining bits, are "0". The control circuit 102 outputs to the DA converter circuit 103N an n-bit digital code obtained by inverting the value of the digital code output to the DA converter circuit 103P for each bit. In this state, the comparison circuit 101 performs comparison determination of the voltage of the node VINP and the voltage of the node VINN. The control circuit 102 determines the value of the (n−1)th bit of the digital value based on the result of the comparison determination in the comparison circuit 101.

After the value of the (n−1)th bit of the digital value is determined, there is performed a comparison operation for determining the value of the (n−2)th bit, which is the second bit from the high-order side of the digital value. At this time, the control circuit 102 outputs to the DA converter circuit 103P an n-bit digital code in which the value of the (n−1)th bit is the determined digital value, the value of the (n−2)th bit is "1", and the values of the (n−3)th bit to the 0th bit, which are the remaining bits, are "0". The control circuit 102 outputs to the DA converter circuit 103N an n-bit digital code obtained by inverting the value of the digital code output to the DA converter circuit 103P for each bit. In this state, the comparison circuit 101 performs comparison determination of the voltage of the node VINP and the voltage of the node VINN. The control circuit 102 determines the value of the (n−2)th bit of the digital value based on the result of the comparison determination in the comparison circuit 101.

Thereafter, by sequentially determining the values of the (n−3)th bit, the (n−4)th bit, . . . , the 1st bit, and the 0th bit in the same manner, the SAR type AD converter circuit 100 converts the analog voltages input to the analog voltage input nodes INP and INN into n-bit digital values.

FIG. 2 is a diagram illustrating a configuration example of the comparison circuit 101. The comparison circuit 101 includes a dynamic comparator (to be also referred to simply as "comparator" below) 210, a determination assist circuit 220, a latch circuit 230, and a clock generation circuit 240. In the following, the analog voltage VINP indicates the voltage of the node VINP, and the analog voltage VINN indicates the voltage of the node VINN.

The analog voltages VINP and VINN are input to the comparator 210. The comparator 210 performs comparison determination of the analog voltages VINP and VINN in synchronization with the input clock signal CLK, and outputs output signals OPA and ONA corresponding to the result of the comparison determination. The comparator 210 illustrated in FIG. 2 performs the comparison determination of the analog voltages VINP and VINN when the clock signal CLK is at a high level, and enters a reset state when the clock signal CLK is at a low level. In the example illustrated in FIG. 2, the output signals OPA and ONA of the comparator 210 are both reset to "0" (a low level) in the reset state.

The analog voltages VINP and VINN input to the comparator 210 are examples of differential input signals, and the output signals OPA and ONA of the comparator 210 are examples of first differential output signals. The comparator 210 is one example of a differential comparison circuit that performs comparison determination of the differential input signals based on an internal clock signal and generates the first differential output signals that indicate the result of the comparison determination.

The determination assist circuit 220 receives the output signals OPA and ONA of the comparator 210 and outputs output signals OPB and ONB corresponding to them. The output signals OPB and ONB of the determination assist circuit 220 are examples of second differential output signals, and the determination assist circuit 220 is one example of a determination assist circuit that receives the first differential output signals and generates the second differential output signals.

The determination assist circuit 220 normally outputs the output signals OPB and ONB having the same logic level as that of the input output signals OPA and ONA of the comparator 210. However, the determination assist circuit 220 varies the output signals OPB and ONB from the reset value when the metastable state of the comparator 210 occurs and the output signals OPA and ONA of the comparator 210 both remain in a reset state (reset value) and unvaried even after a designed time has elapsed since the start of the comparison determination operation. That is, the determination assist circuit 220 varies at least one of the output signals OPB and ONB to a value different from the reset value when a designed time has elapsed with the output signals OPA and ONA of the comparator 210 both being unvaried from the reset value since the start of the comparison determination operation in the comparator 210. Here, the designed time is a time sufficient for the comparator 210 to complete the comparison determination operation of the analog voltages VINP and VINN (to obtain a fixed result of the comparison determination). The determination assist circuit 220 is configured using logical sum operation circuits (OR circuits) 221 and 222 and buffers 223 and 224, for example.

The OR circuit 221 receives the output signal OPA of the comparator 210 and an assist signal DCLK, and outputs the operation result of the signals OPA and DCLK as the output signal OPB. The OR circuit 222 receives the output signal ONA of the comparator 210 and the assist signal DCLK, and outputs the operation result of the signals ONA and DCLK as the output signal ONB.

The buffers 223 and 224 are connected in series to generate the assist signal DCLK by delaying the clock signal CLK for a designed time. The designed time for delaying the clock signal CLK is a time determined as a time sufficient for the comparator 210 to complete the comparison determination operation of the analog voltages VINP and VINN. The clock signal CLK is one example of an internal clock signal, and the assist signal DCLK is one example of a delayed internal clock signal. For convenience of explanation, the two buffers 223 and 224 are illustrated in FIG. 2, but the number of buffers may be adjusted as needed to achieve a delay for the designed time.

With this configuration, the determination assist circuit 220 outputs the output signals OPB and ONB of "1" (at a high level) regardless of the output signals OPA and ONA of the comparator 210 during the period from the time when the clock signal CLK varies from a low level to a high level and the designed time elapses until the time when the clock signal CLK varies from a high level to a low level and the designed time elapses. During the period other than the above, the determination assist circuit 220 outputs the output signals OPB and ONB having the same logic level as that of the output signals OPA and ONA of the comparator 210.

The latch circuit 230 latches the output signals OPB and ONB of the determination assist circuit 220. The output signals OUTP and OUTN of the latch circuit 230 are output as the output signals of the comparison circuit 101. The output signals OUTP and OUTN of the latch circuit 230 are examples of third differential output signals, and the latch circuit 230 is one example of a latch circuit that latches the second differential output signals and generates the third differential output signals. The latch circuit 230 is configured using negative logical product operation circuits (NAND circuits) 231 and 232, for example.

The output signal OPB of the determination assist circuit 220 and the output of the NAND circuit 232 are input to the NAND circuit 231. The output signal ONB of the determination assist circuit 220 and the output of the NAND circuit 231 are input to the NAND circuit 232. In this manner, the two NAND circuits 231 and 232 configure a latch circuit, the output of the NAND circuit 231 is output as the output signal OUTP, and the output of the NAND circuit 232 is output as the output signal OUTN.

The clock generation circuit 240 generates and outputs the clock signal CLK based on the output signals OUTP and OUTN. The clock generation circuit 240 is one example of a clock generation circuit that generates an internal clock signal based on the third differential output signals. The clock generation circuit 240 is configured using a logical product operation circuit (AND circuit) 241, for example. The AND circuit 241 receives the output signals OUTP and OUTN and the control signal START, and outputs the operation result of the signals OUTP, OUTN, and START as the clock signal CLK. The control signal START is set to a low level in the sampling period in the AD conversion operation, and is set to a high level in the comparison period in the AD conversion operation.

FIG. 3 is a diagram illustrating a configuration example of the dynamic comparator 210. The dynamic comparator 210 includes N-channel type transistors 301, 302, 303, 305, 307, 309, and 311 and P-channel type transistors 304, 306, 308, 310, 312, 313, 314, and 315.

The N-channel type transistors 301 and 302 are a pair of input transistors to which differential input signals are input in the dynamic comparator 210. The N-channel type transistor 301 has a source thereof connected to a drain of the N-channel type transistor 303, has a gate thereof connected to the node VINN that supplies the analog voltage, and has a drain thereof connected to a source of the N-channel type transistor 305. The N-channel type transistor 302 has a source thereof connected to the drain of the N-channel type transistor 303, has a gate thereof connected to the node VINP that supplies the analog voltage, and has a drain thereof connected to a source of the N-channel type transistor 307.

The N-channel type transistor 303 has a source thereof connected to a power supply line to which a reference potential (ground level, ground potential) VSS is supplied, and has the clock signal CLK input to a gate thereof. The N-channel type transistor 303 is on/off controlled according to the clock signal CLK input to the gate, and is turned off in the reset period (the period when the clock signal CLK is at a low level) and turned on in the period when the comparison determination is performed (the period when the clock signal CLK is at a high level) to operate as a current source.

The P-channel type transistor 304 has a source thereof connected to a power supply line to which a power supply voltage VDD is supplied and has a drain thereof connected to a drain of the N-channel type transistor 305. The P-channel type transistor 306 has a source thereof connected to the power supply line to which the power supply voltage VDD is supplied and has a drain thereof connected to a drain of the N-channel type transistor 307. A gate of the P-channel type transistor 304 and a gate of the N-channel type transistor 305 are connected to a connection point between a drain of the P-channel type transistor 306 and the drain of the N-channel type transistor 307. A gate of the P-channel type transistor 306 and a gate of the N-channel type transistor 307 are connected to a connection point between a drain of the P-channel type transistor 304 and the drain of the N-channel type transistor 305.

That is, a first inverter formed of the P-channel type transistor 304 and the N-channel type transistor 305 and a second inverter formed of the P-channel type transistor 306 and the N-channel type transistor 307 are cross-connected so as to establish a connection between one input end and the other output end, to then form a latch.

The P-channel type transistor 308 has a source thereof connected to the power supply line to which the power supply voltage VDD is supplied and has a drain thereof connected to a drain of the N-channel type transistor 309. The N-channel type transistor 309 has a source thereof connected to the power supply line to which the reference potential (ground level, ground potential) VSS is supplied. A gate of the P-channel type transistor 308 and a gate of the N-channel type transistor 309 are connected to the connection point between the drain of the P-channel type transistor 306 and the drain of the N-channel type transistor 307. The potential of a connection point between the drain of the P-channel type transistor 308 and the drain of the N-channel type transistor 309 is output as the output signal OPA. That is, the P-channel type transistor 308 and the N-channel type transistor 309 form a third inverter whose input end is connected to the connection point between the drain of the P-channel type transistor 306 and the drain of the N-channel type transistor 307 (with the output of the second inverter set as an input), and the output of this third inverter is output as the output signal OPA.

The P-channel type transistor 310 has a source thereof connected to the power supply line to which the power supply voltage VDD is supplied and has a drain thereof connected to a drain of the N-channel type transistor 311. The N-channel type transistor 311 has a source thereof connected to the power supply line to which the reference potential (ground level, ground potential) VSS is supplied. A gate of the P-channel type transistor 310 and a gate of the N-channel type transistor 311 are connected to the connection point between the drain of the P-channel type transistor 304 and the drain of the N-channel type transistor 305. The potential of a connection point between the drain of the P-channel type transistor 310 and the drain of the N-channel type transistor 311 is output as the output signal ONA. That is, the P-channel type transistor 310 and the N-channel type transistor 311 form a fourth inverter whose input end is connected to the connection point between the drain of the P-channel type transistor 304 and the drain of the N-channel type transistor 305 (with the output of the first inverter set as an input), and the output of this fourth inverter is output as the output signal ONA.

The P-channel type transistors 312, 313, 314, and 315 have sources thereof connected to the power supply line to which the power supply voltage VDD is supplied, and have the clock signal CLK input to gates thereof. A drain of the P-channel type transistor 312 is connected to the connection point between the drain of the P-channel type transistor 304 and the drain of the N-channel type transistor 305. A drain of the P-channel type transistor 313 is connected to a connection point between the drain of the N-channel type transistor 301 and the source of the N-channel type transistor 305. A drain of the P-channel type transistor 314 is connected to the connection point between the drain of the P-channel type transistor 306 and the drain of the N-channel type transistor 307. A drain of the P-channel type transistor 315 is connected to a connection point between the drain of the N-channel type transistor 302 and the source of the N-channel type transistor 307.

The P-channel type transistors 312, 313, 314, and 315 are on/off controlled according to the clock signal CLK input to their gates. The P-channel type transistors 312, 313, 314, and 315 are turned off during the period when the comparison determination is performed (the period when the clock signal CLK is at a high level) and are turned on during the reset period (the period when the clock signal CLK is at a low level) to operate to set the node to which their drains are connected to "1" (a high level).

In the dynamic comparator 210 illustrated in FIG. 3, when the clock signal CLK is at a low level, the N-channel type transistor 303 is turned off and the P-channel type transistors 312, 313, 314, and 315 are turned on. As a result, the connection point between the drain of the P-channel type transistor 306 and the drain of the N-channel type transistor 307 becomes "1" (goes to a high level), and thereby the connection point between the drain of the P-channel type transistor 308 and the drain of the N-channel type transistor 309 becomes "0" (goes to a low level) and the output signal OPA of "0" (at a low level) is output. In the same manner, the connection point between the drain of the P-channel type transistor 304 and the drain of the N-channel type transistor 305 becomes "1" (goes to a high level), and thereby the connection point between the drain of the P-channel type transistor 310 and the drain of the N-channel type transistor 311 becomes "0" (goes to a low level) and the output signal ONA of "0" (at a low level) is output. Thus, when the clock signal CLK is at a low level, the dynamic comparator 210 enters a reset state, and the output signals OPA and ONA are both reset to "0" (a low level).

In the dynamic comparator 210, when the clock signal CLK is at a high level, the P-channel type transistors 312, 313, 314, and 315 are turned off and the N-channel type transistor 303 is turned on, and the N-channel type transistor 303 operates as a current source. Then, the difference between the voltages of the nodes VINP and VINN when the clock signal CLK goes to a high level from a low level creates a difference in potential between the node to which the drain of the N-channel type transistor 302 is connected and the node to which the drain of the N-channel type transistor 301 is connected. This potential difference is amplified in the latch formed of the P-channel type transistors 304 and 306 and the N-channel type transistors 305 and 307, and one of the connection point between the drain of the P-channel type transistor 304 and the drain of the N-channel type transistor 305 and the connection point between the drain of the P-channel type transistor 306 and the drain of the N-channel type transistor 307 varies from "1" (a high level) to "0" (a low level). With this, one of the connection point between the drain of the P-channel type transistor 308 and the drain of the N-channel type transistor 309 and the connection point between the drain of the P-channel type transistor 310 and the drain of the N-channel type transistor 311 varies from "0" (a low level) to "1" (a high level). Thus, when the clock signal CLK is at a high level, the dynamic comparator 210 performs the comparison determination of the analog voltages, and one of the output signals OPA and ONA becomes "1" (goes to a high level) according to the result of the comparison determination.

Here, in the comparison circuit 101 illustrated in FIG. 2, the determination assist circuit 220 delays the input clock signal CLK for a designed time to generate the assist signal DCLK. In the comparison circuit 101 illustrated in FIG. 2, the assist signal DCLK is delayed for a designed time with respect to the clock signal CLK both at rising when the assist signal DCLK varies from a low level to a high level, and at falling when the assist signal DCLK varies from a high level to a low level. During the period when the assist signal DCLK is at a high level, the output signals OPB and ONB of the determination assist circuit 220 are both "1" (a high level). In this case, the latch circuit 230 in the subsequent stage maintains the output signals OUTP and OUTN, and the clock signal CLK output from the clock generation circuit 240 is also maintained at a low level. That is, during the period when the assist signal DCLK is at a high level, even if the comparator 210 is reset and the output signals OPA and ONA both become "0" (go to a low level), the comparison determination operation of the analog voltages VINP and VINN, which is for determining the value of the next bit, is not started.

From the viewpoint of the time taken for the AD conversion operation, the comparison determination operation of the analog voltages VINP and VINN, which is for determining the value of the next bit, is preferably started immediately after the comparator 210 is reset and the output signals OPA and ONA both become "0" (go to a low level). Thus, by using such a determination assist circuit 220 as illustrated in FIG. 4A, the assist signal DCLK may be delayed for a designed time with respect to the clock signal CLK at rising when the assist signal DCLK varies from a low level to a high level, and may be varied with a small delay with respect to the clock signal CLK at falling when the assist signal DCLK varies from a high level to a low level.

Figure 4A:
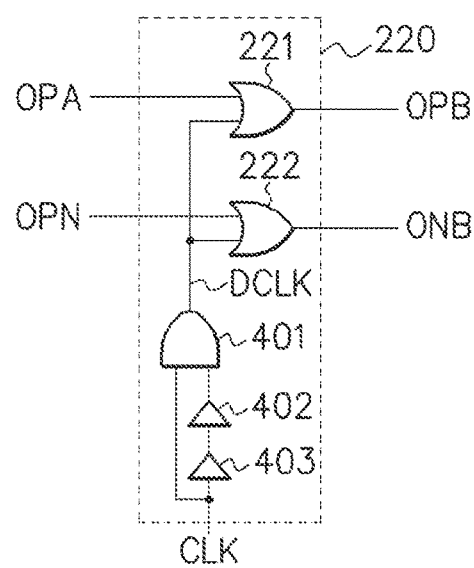
FIG. 4A is a diagram illustrating another configuration example of a determination assist circuit.

FIG. 4A is a diagram illustrating another configuration example of the determination assist circuit. In FIG. 4A, components having the same functions as those illustrated in FIG. 2 are denoted by the same reference numerals and symbols, and redundant explanations are omitted. The determination assist circuit 220 illustrated in FIG. 4A is configured using OR circuits 221 and 222, an AND circuit 401, and buffers 402 and 403. The AND circuit 401 receives the clock signal CLK and the clock signal CLK delayed for a certain time by the buffers 402 and 403 connected in series.

Figure 4B:
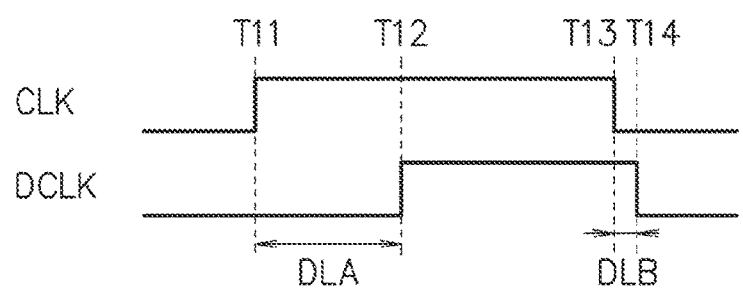
FIG. 4B is a view explaining an example of an operation of the determination assist circuit illustrated in FIG. 4A.

The determination assist circuit 220 is configured as illustrated in FIG. 4A, and thereby, as illustrated in FIG. 4B, after the clock signal CLK rises at a time T11, the assist signal DCLK, which is delayed for a designed time DLA corresponding to the delay in the AND circuit 401 and the buffers 402 and 403 and rises at a time T12, can be generated. Further, after the clock signal CLK falls at a time T13, the assist signal DCLK, which is delayed for a time DLB smaller than the designed time DLA, corresponding to the delay in the AND circuit 401 and falls, can be generated. As a result, when the clock signal CLK goes to a low level and the output signals OPA and ONA of the comparator 210 are both reset to "0" (a low level), it becomes possible to immediately start the comparison determination operation of the analog voltages VINP and VINN for determining the value of the next bit.

Next, there is explained the operation of the comparison circuit 101 in the SAR type AD converter circuit 100 in this embodiment.

Figure 5A:
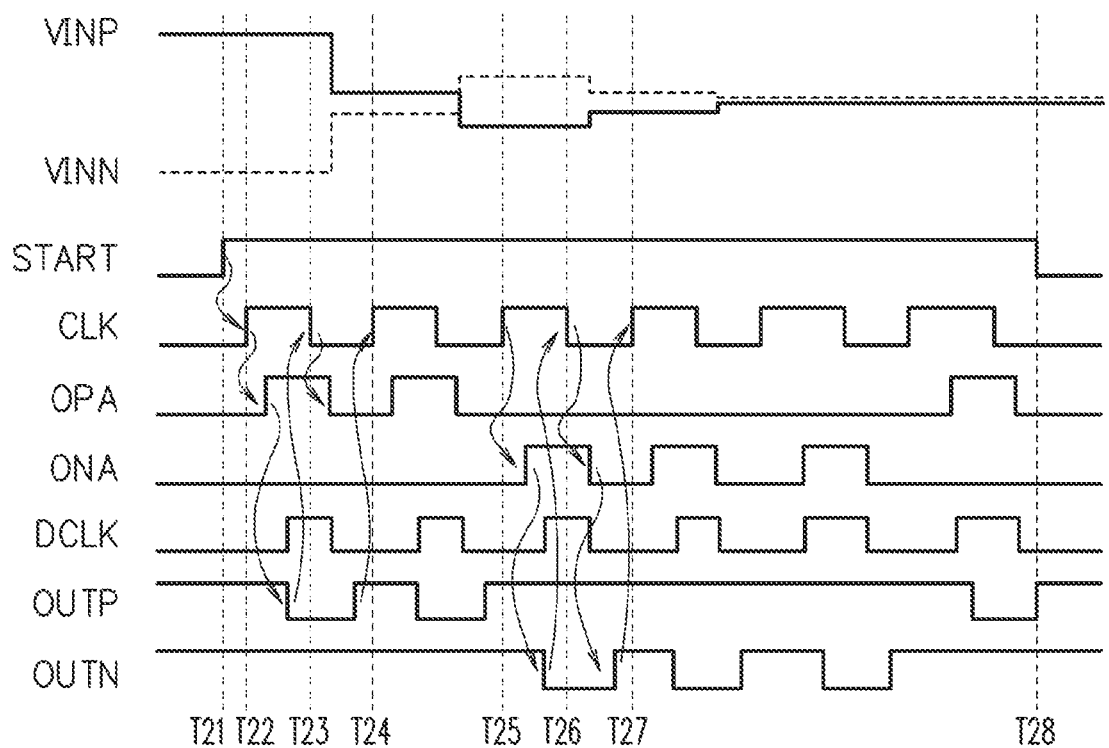
FIG. 5A is a view explaining an example of an operation of the comparison circuit in the first embodiment.

FIG. 5A is a view explaining an example of the operation of the comparison circuit 101. At a time T21, the input control signal START goes to a high level and the comparison period in the AD conversion operation is started. Before the start of the comparison period in the AD conversion operation (in the sampling period in the AD conversion operation), the input control signal START is at a low level and the clock signal CLK output from the clock generation circuit 240 is also maintained at a low level. Therefore, before the start of the comparison period in the AD conversion operation, regardless of the analog voltages VINP and VINN, the output signals OPA and ONA of the comparator 210 are both reset to "0" (a low level), and the output signals OPB and ONB of the determination assist circuit 220 are also both "0" (a low level). As a result, the output signals OUTP and OUTN of the latch circuit 230, which are the output signals of the comparison circuit 101, are both "1" (a high level).

When the control signal START goes to a high level at the time T21, at a time T22, the clock signal CLK output from the clock generation circuit 240 goes to a high level. When the clock signal CLK goes to a high level at the time T22, the comparison determination operation of the analog voltages VINP and VINN, which is for determining the value of the MSB of the digital value, is started. As in the example illustrated in FIG. 5A, when the analog voltage VINP is higher than the analog voltage VINN, the output signal OPA of the comparator 210 becomes "1" (goes to a high level) according to the result of the comparison determination in the comparator 210. In this example, the output signal OPA of the comparator 210 becomes "1" (goes to a high level) before the assist signal DCLK varies to a high level as the clock signal CLK varies to a high level, that is, within a designed time sufficient to complete the comparison determination operation. In this case, regarding the output signals OPB and ONB of the determination assist circuit 220, the output signal OPB becomes "1" (goes to a high level) and the output signal ONB remains "0" (at a low level). When the output signal OPB of the determination assist circuit 220 becomes "1" (goes to a high level), the output signal OPB is latched by the latch circuit 230, and the output signal OUTP of the latch circuit 230 becomes "0" (goes to a low level).

The output signal OUTP of the latch circuit 230 becomes "0" (goes to a low level), and thereby the clock signal CLK goes to a low level at a time T23 assuming that the result of the comparison determination is obtained (the comparison determination is completed). The clock signal CLK goes to a low level, and thereby the output signals OPA and ONA of the comparator 210 are both reset to "0" (a low level). Further, the assist signal DCLK varies to a low level as the clock signal CLK varies to a low level. As a result, the output signals OPB and ONB of the determination assist circuit 220 both become "0" (go to a low level), and the output signals OUTP and OUTN of the latch circuit 230, which are the output signals of the comparison circuit, both become "1" (go to a high level). Then, the output signals OUTP and OUTN of the latch circuit 230 both become "1" (go to a high level), and thereby the clock signal CLK goes to a high level at a time 124 and the comparison determination operation of the input analog voltages VINP and VINN, which is for determining the value of the second bit from the high-order side of the digital value, is started.

The operation when the analog voltage VINP is lower than the analog voltage VINN and the output signal ONA of the comparator 210 becomes "1" (goes to a high level) according to the result of the comparison determination in the comparator 210, as at times T25 to T27 in the example illustrated in FIG. 5A, is as follows. When the clock signal CLK goes to a high level at the time T25, the comparison determination operation of the analog voltages VINP and VINN, which is for determining the digital value, is started. When the analog voltage VINP is lower than the analog voltage VINN, the output signal ONA of the comparator 210 becomes "1" (goes to a high level) according to the result of the comparison determination in the comparator 210. In this case as well, the output signal ONA of the comparator 210 becomes "1" (goes to a high level) before the assist signal DCLK varies to a high level as the clock signal CLK varies to a high level, that is, within a designed time sufficient to complete the comparison determination operation. In this case, regarding the output signals OPB and ONB of the determination assist circuit 220, the output signal ONB becomes "1" (goes to a high level) and the output signal OPB remains "0" (at a low level). When the output signal ONB of the determination assist circuit 220 becomes "1" (goes to a high level), the output signal ONB is latched by the latch circuit 230 and the output signal OUTN of the latch circuit 230 becomes "0" (goes to a low level).

The output signal OUTN of the latch circuit 230 becomes "0" (goes to a low level), and thereby the clock signal CLK goes to a low level at the time T26 assuming that the result of the comparison determination is obtained (the comparison determination is completed). The clock signal CLK goes to a low level, and thereby the output signals OPA and ONA of the comparator 210 are both reset to "0" (a low level). Further, the assist signal DCLK varies to a low level as the clock signal CLK varies to a low level. As a result, the output signals OPB and ONB of the determination assist circuit 220 both become "0" (go to a low level), and the output signals OUTP and OUTN of the latch circuit 230, which are the output signals of the comparison circuit, both become "1" (go to a high level). Then, the output signals OUTP and OUTN of the latch circuit 230 both become "1" (go to a high level), and thereby the clock signal CLK goes to a high level at the time T27 and the comparison determination operation of the analog voltages VINP and VINN, which is for determining the value of the next bit of the digital value, is started.

In this way, the value is determined sequentially from the high-order side of the digital value, and at a time T28 when the time specified as the comparison period has elapsed, the input control signal START goes to a low level and the AD conversion operation is finished.

Figure 5B:
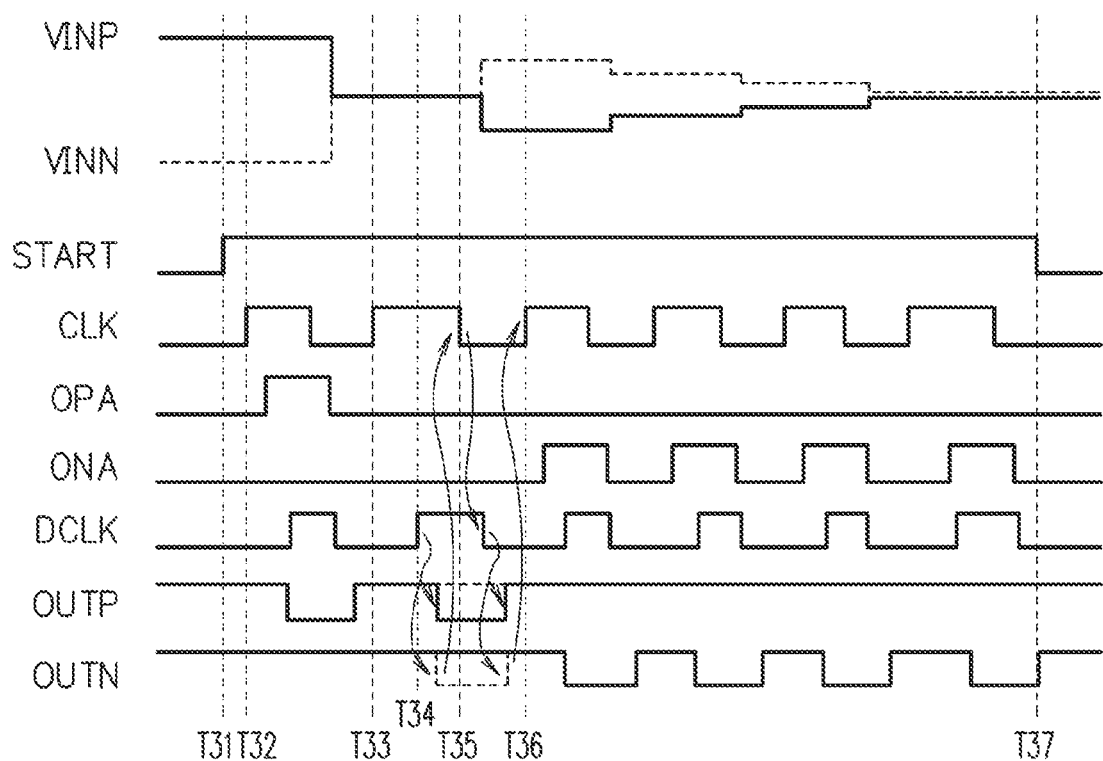
FIG. 5B is a view explaining an example of the operation of the comparison circuit in the first embodiment.

Next, with reference to FIG. 5B, there is explained the operation when the metastable state of the comparator 210 occurs in the comparison circuit 101. FIG. 5B illustrates an example where the metastable state of the comparator 210 occurs in the comparison determination operation for determining the value of the second bit from the high-order side of the digital value.

At a time T31, the input control signal START goes to a high level and the comparison period in the AD conversion operation is started. Before the start of the comparison period in the AD conversion operation (in the sampling period in the AD conversion operation), as in the example illustrated in FIG. 5A, the output signals OPA and ONA of the comparator 210 and the output signals OPB and ONB of the determination assist circuit 220 are both "0" (a low level), and the output signals OUTP and OUTN of the latch circuit 230, which are the output signals of the comparison circuit 101, are both "1" (a high level).

When the control signal START goes to a high level at the time T31, at a time T32, the clock signal CLK output from the clock generation circuit 240 goes to a high level. Thereby, the comparison determination operation of the analog voltages VINP and VINN, which is for determining the value of the MSB of the digital value, is started.

When the clock signal CLK goes to a high level at a time T33 after the value of the MSB of the digital value is determined, the comparison determination operation of the analog voltages VINP and VINN, which is for determining the value of the second bit from the high-order side of the digital value, is started. As in the example illustrated in FIG. 5B, when the difference between the analog voltage VINP and the analog voltage VINN is small and the metastable state of the comparator 210 occurs, the output signals OPA and ONA of the comparator 210 remain unvaried from "0" (a low level), which is the reset value, for a long time since the comparison determination operation is started. Then, without the output signals OPA and ONA of the comparator 210 varying according to the result of the comparison determination, the assist signal DCLK varies to a high level at a time T34 after a designed time sufficient to complete the comparison determination operation has elapsed since the time T33 when the clock signal CLK varies to a high level. As a result, the output signals OPB and ONB of the determination assist circuit 220 become "1" (go to a high level), and one of the output signals OUTP and OUTN of the latch circuit 230 becomes "0" (goes to a low level) according to the time before or after the output signals OPB and ONB that have become "1" (have gone to a high level) reach the latch circuit 230. Thereafter, even if the comparison determination is completed and the output signals OPA and ONA of the comparator 210 vary, the output signals OUTP and OUTN of the latch circuit 230 remain unvaried.

One of the output signals OUTP and OUTN of the latch circuit 230 becomes "0" (goes to a low level), and thereby the clock signal CLK goes to a low level at a time T35 assuming that the comparison determination is completed. The clock signal CLK goes to a low level, and thereby the output signals OPA and ONA of the comparator 210 are both reset to "0" (a low level). Further, the assist signal DCLK varies to a low level as the clock signal CLK varies to a low level. As a result, the output signals OPB and ONB of the determination assist circuit 220 both become "0" (go to a low level), and the output signals OUTP and OUTN of the latch circuit 230, which are the output signals of the comparison circuit, both become "1" (go to a high level). Then, the output signals OUTP and OUTN of the latch circuit 230 both become "1" (go to a high level), and thereby the clock signal CLK goes to a high level at a time T36, and the comparison determination operation of the analog voltages VINP and VINN, which is for determining the value of the third bit from the high-order side, being the next bit, of the digital value, is started.

As above, in the comparison circuit 101 in this embodiment, when the metastable state of the comparator 210 occurs and the output signals OPA and ONA of the comparator 210 are the reset value even after a designed time has elapsed since the comparison determination operation is started, the output signals OUTP and OUTN of the latch circuit 230 are varied by varying the values of the output signals OPB and ONB using the assist signal DCLK in the determination assist circuit 220. As a result, in the SAR type AD converter circuit 100, even if the metastable state of the comparator 210 occurs during the comparison determination operation in the comparison circuit 101, it is possible to shift to the operation for determining the value of the next bit in a short time, and to determine the value of all the bits of the digital value and complete the AD conversion operation within the time specified as the comparison period.

Here, when the metastable state of the comparator 210 occurs during the comparison determination operation in the comparison circuit 101, the value of the target bit of the digital value becomes a different value depending on which of the output signals OUTP and OUTN of the latch circuit 230 as the output signal of the comparison circuit 101 becomes "0" (goes to a low level). However, the comparator 210 is in a state where the metastable state occurs, and thus, even if either of the output signals OUTP and OUTN becomes "0" (goes to a low level), the error in the digital value obtained by the AD conversion is small, considering the subsequent comparison determination with the lower-side bits. The error in the digital value obtained by the AD conversion can be estimated from, for example, the time from the start of the comparison determination operation until the time when the values of the output signals OPB and ONB are varied by the assist signal DCLK, or other means.

Figure 6:
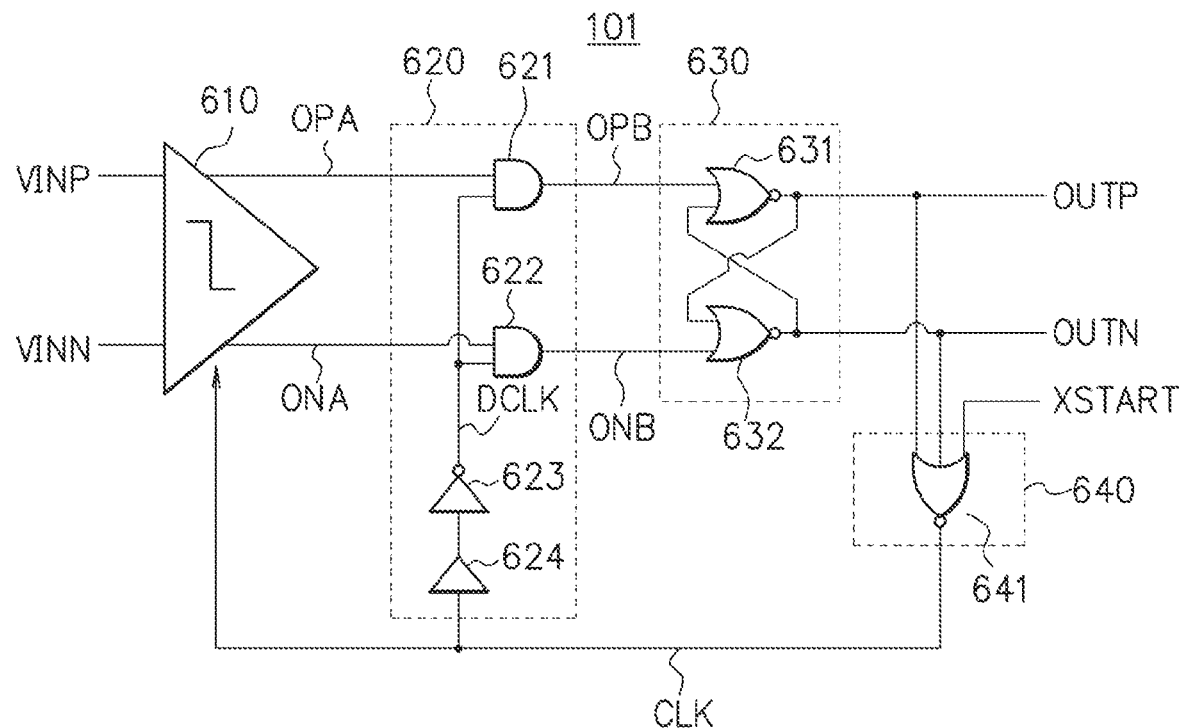
FIG. 6 is a diagram illustrating another configuration example of the comparison circuit in the first embodiment.

FIG. 6 is a diagram illustrating another configuration example of the comparison circuit 101 in the first embodiment. The comparison circuit 101 illustrated in FIG. 2 uses the dynamic comparator 210 in which the reset value of the output signals OPA and ONA is "0" (a low level). In contrast to this, a comparison circuit 101 illustrated in FIG. 6 is an example using a dynamic comparator 610 in which the reset value of the output signals OPA and ONA is "1" (a high level).

The comparison circuit 101 illustrated in FIG. 6 includes the dynamic comparator 610, a determination assist circuit 620, a latch circuit 630, and a clock generation circuit 640. The comparator 610, the determination assist circuit 620, the latch circuit 630, and the clock generation circuit 640 correspond to the comparator 210, the determination assist circuit 220, the latch circuit 230, and the clock generation circuit 240 illustrated in FIG. 2 respectively, and achieve the same operation as that of those.

However, in the example illustrated in FIG. 6, the output signals OPA and ONA of the comparator 610 are both reset to "1" (a high level) in the reset state. The determination assist circuit 620 is configured using AND circuits 621 and 622, an inverter 623, and a buffer 624, for example. The latch circuit 630 is configured using negative logical sum operation circuits (NOR circuits) 631 and 632, for example. The clock generation circuit 640 is configured using a NOR circuit 641, for example.

In the determination assist circuit 620, the AND circuit 621 receives the output signal OPA of the comparator 610 and the assist signal DCLK, and outputs the operation result of the signals OPA and DCLK as the output signal OPB. The AND circuit 622 receives the output signal ONA of the comparator 610 and the assist signal DCLK, and outputs the operation result of the signals ONA and DCLK as the output signal ONB. The inverter 623 and the buffer 624 are connected in series to delay the clock signal CLK for a designed time and invert it, to thereby generate the assist signal DCLK. The designed time for delaying the clock signal CLK is the same as that in the comparison circuit illustrated in FIG. 2. Although FIG. 6 illustrates the example using the single inverter 623 and the single buffer 624, the number of inverters and the number of buffers are not limited to this as long as the clock signal CLK can be delayed for a designed time and inverted.

In the latch circuit 630, the NOR circuit 631 receives the output signal OPB of the determination assist circuit 620 and the output of the NOR circuit 632. The NOR circuit 632 receives the output signal ONB of the determination assist circuit 620 and the output of the NOR circuit 631. Thus, the two NOR circuits 631 and 632 form a latch circuit, the output of the NOR circuit 631 is output as the output signal OUTP, and the output of the NOR circuit 632 is output as the output signal OUTN.

In the clock generation circuit 640, the NOR circuit 641 receives the output signals OUTP and OUTN and a control signal XSTART, and outputs the operation result of the signals OUTP, OUTN, and XSTART as the clock signal CLK. The control signal XSTART is an inverted signal of the control signal START, and is set to a high level in the sampling period in the AD conversion operation and is set to a low level in the comparison period in the AD conversion operation.

In the comparison circuit 101 illustrated in FIG. 6 as well, from the viewpoint of the time taken for the AD conversion operation, the comparison determination operation of the analog voltages VINP and VINN, which is for determining the value of the next bit, is preferably started immediately after the comparator 610 is reset and the output signals OPA and ONA both become "1" (go to a high level). Then, in the determination assist circuit 620 as well, as in the example illustrated in FIG. 4A, the logic circuit or the like may be used to delay the assist signal DCLK for a designed time with respect to rising of the clock signal CLK at falling when the assist signal DCLK varies from a high level to a low level, and to vary the assist signal DCLK with a small delay with respect to falling of the clock signal CLK at rising when the assist signal DCLK varies from a low level to a high level.

Second Embodiment

Next, there is explained a second embodiment.

The configuration of a SAR type AD converter circuit in the second embodiment is the same as that of the SAR type AD converter circuit 100 in the first embodiment illustrated in FIG. 1, and thus the explanation is omitted.

Figure 7:
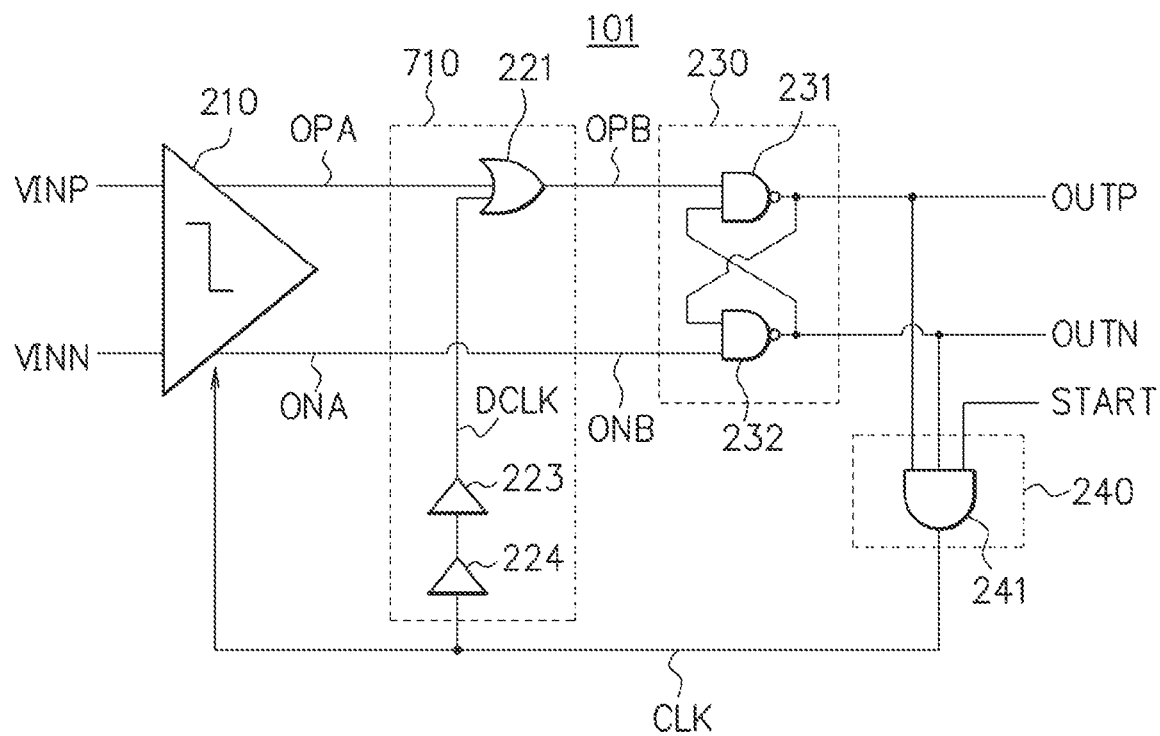
FIG. 7 is a diagram illustrating a configuration example of a comparison circuit in a second embodiment.

FIG. 7 is a diagram illustrating a configuration example of a comparison circuit 101 in the second embodiment. In FIG. 7, components having the same functions as the components illustrated in FIG. 2 are denoted by the same reference numerals and symbols, and redundant explanations are omitted. The comparison circuit 101 in the second embodiment is different from the comparison circuit 101 in the first embodiment illustrated in FIG. 2 in a determination assist circuit 710, and the other components (a dynamic comparator 210, a latch circuit 230, and a clock generation circuit 240) are the same as those in the comparison circuit 101 in the first embodiment illustrated in FIG. 2.

In the first embodiment, the determination assist circuit 220 can control both the output signals OPB and ONB by the assist signal DCLK. In the second embodiment, the determination assist circuit 710 can control one of the output signals OPB and ONB by the assist signal DCLK. FIG. 7 illustrates an example where the determination assist circuit 710 can control the output signal OPB by the assist signal DCLK.

In the comparison circuit 101 illustrated in FIG. 7, the determination assist circuit 710 receives the output signals OPA and ONA of the comparator 210 and outputs the corresponding output signals OPB and ONB. The determination assist circuit 710 normally outputs the output signal OPB having the same logic level as that of the input output signal OPA of the comparator 210. However, the determination assist circuit 710 varies the output signal OPB from the reset value when the metastable state of the comparator 210 occurs and the output signals OPA and ONA of the comparator 210 both remain in a reset state (reset value) and unvaried even after a designed time has elapsed since the comparison determination operation is started. Further, the determination assist circuit 710 outputs the input output signal ONA of the comparator 210 as it is as the output signal ONB. The determination assist circuit 710 is configured using an OR circuit 221 and buffers 223 and 224, for example.

The OR circuit 221 receives the output signal OPA of the comparator 210 and the assist signal DCLK, and outputs the operation result of the signals OPA and DCLK as the output signal OPB. The buffers 223 and 224 are connected in series and generate the assist signal DCLK by delaying the clock signal CLK for a designed time. The designed time for delaying the clock signal CLK is the same as that of the comparison circuit 101 in the first embodiment. For convenience of explanation, the two buffers 223 and 224 are illustrated in FIG. 7, but the number of buffers may be adjusted as needed to achieve a delay for the designed time.

With this configuration, the determination assist circuit 710 outputs "1" (a high level) as the output signal OPB regardless of the output signal OPA of the comparator 210 during the period from the time when the clock signal CLK varies from a low level to a high level and the designed time elapses until the time when the clock signal CLK varies from a high level to a low level and the designed time elapses. During the period other than the above, the determination assist circuit 710 outputs the same logic level as that of the output signal OPA of the comparator 210 as the output signal OPB.

In the comparison circuit 101 in the second embodiment, when the metastable state of the comparator 210 occurs and the output signals OPA and ONA of the comparator 210 are the reset value even after a designed time has elapsed since the comparison determination operation is started, the output signal OUTP of the latch circuit 230 is varied by varying the value of the output signal OPB using the assist signal DCLK in the determination assist circuit 710. As a result, in the SAR type AD converter circuit, even when the metastable state of the comparator 210 occurs during the comparison determination operation in the comparison circuit 101, it is possible to shift to the operation for determining the value of the next bit in a short time and complete the AD conversion operation within the time specified as the comparison period.

FIG. 7 illustrates the example where the determination assist circuit 710 can control the output signal OPB by the assist signal DCLK, but it can also be configured to control the output signal ONB by the assist signal DCLK. Further, similarly to the previously-described embodiment, the assist signal DCLK may be varied with a delay for a designed time with respect to rising of the clock signal CLK, and varied with a small delay with respect to falling of the clock signal CLK. Further, similarly to the previously-described embodiment, the case of using the dynamic comparator in which the reset value of the output signals OPA and ONA is "1" (a high level) is also applicable.

Third Embodiment

Next, there is explained a third embodiment.

Figure 8:
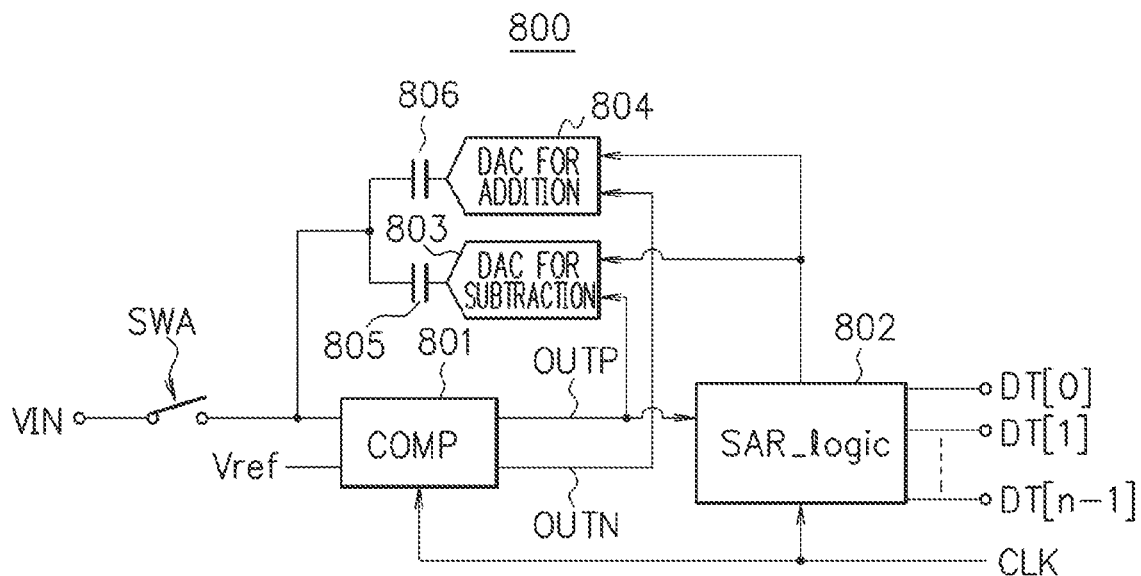
FIG. 8 is a diagram illustrating a configuration example of an analog-to-digital converter circuit in a third embodiment.

FIG. 8 is a diagram illustrating a configuration example of an AD converter circuit in the third embodiment. The AD converter circuit in this embodiment is a SAR type AD converter circuit, for example. FIG. 8 illustrates, as an example, an n-bit SAR type AD converter circuit 800, where n is a natural number, that converts an analog voltage input to the analog voltage input node VIN into n-bit digital values and outputs them from output nodes DT[0] to DT[n-1]. The SAR type AD converter circuit 800 illustrated in FIG. 8 is a synchronous type AD converter circuit that performs a comparison operation in synchronization with an externally supplied clock signal CLK.

The SAR type AD converter circuit 800 includes a switch SWA, a comparison circuit (COMP) 801, a control circuit (SAR_logic) 802, a DA converter circuit for subtraction 803, a DA converter circuit for addition 804, and capacitors 805 and 806.

The comparison circuit 801 has a first input end connected to one end of the switch SWA and one ends of the capacitors 805 and 806. The other end of the switch SWA is connected to the analog voltage input node VIN. The other end of the capacitor 805 is connected to an output end of the DA converter circuit for subtraction 803, and the other end of the capacitor 806 is connected to an output end of the DA converter circuit for addition 804. A reference voltage Vref is supplied to a second input end of the comparison circuit 801. The comparison circuit 801 performs comparison determination of the voltage of the first input end and the voltage of the second input end (reference voltage Vref), and outputs the signals OUTP and OUTN indicating the result of the comparison determination. The comparison circuit 801 in this embodiment is a comparison circuit using the dynamic comparator that operates in synchronization with a clock signal, and is configured in the same manner as the previously-described embodiments. However, unlike the comparison circuit 101 in the previously-described embodiments, the comparison circuit 801 is a synchronous type comparison circuit that operates in synchronization with the externally supplied clock signal CLK. Therefore, the comparison circuit 801 does not include the clock generation circuit 240 or 640 because it does not need to internally generate a clock signal.

The control circuit 802 controls the AD conversion operation in the SAR type AD converter circuit 800. The control circuit 802 controls the SAR type AD converter circuit 800 to sample the analog voltage in the sampling period in the AD conversion operation and perform a comparison operation on the analog voltage in the comparison period in the AD conversion operation according to the control signal to generate. For example, the control circuit 802 controls the switch SWA to be turned on (closed state, conducting state) in the sampling period and to be turned off (open state, non-conducting state) in the comparison period. The control circuit 802 sequentially determines the value of each bit of the digital value, which is the result of conversion of the analog voltage, based on the signal OUTP output from the comparison circuit 801. Based on the sequentially determined digital values, the control circuit 802 generates a comparison target bit control signal indicating which bit of a plurality of the bits of the digital value is currently being compared, and outputs it to the DA converter circuits 803 and 804.

The DA converter circuit for subtraction 803 generates and outputs an analog voltage based on the comparison target bit control signal output from the control circuit 802 and the output signal OUTP of the comparison circuit 801. The DA converter circuit for addition 804 generates and outputs an analog voltage based on the comparison target bit control signal output from the control circuit 802 and the output signal OUTN of the comparison circuit 801. The DA converter circuits 803 and 804 may be configured using, for example, a capacitive DA converter circuit, or may be configured using both a capacitive DA converter circuit and a resistive DA converter circuit in combination.

In the SAR type AD converter circuit 800, in the sampling period during the AD conversion operation, the control circuit 802 controls the switch SWA to be turned on (closed state, conducting state) to sample the analog voltage input to the analog voltage input node VIN. After sampling the analog voltage, the control circuit 802 controls the switch SWA to be turned off (open state, non-conducting state).

In the SAR type AD converter circuit 800, in the comparison period after the sampling period during the AD conversion operation, the comparison circuit 801 performs a comparison operation of the voltage of the first input end and the voltage of the second input end (reference voltage Vref) to sequentially determine the value of each bit of the digital value. At this time, the SAR type AD converter circuit 800 controls the DA converter circuit for subtraction 803 based on the comparison target bit control signal according to the variation in the output signal OUTP of the comparison circuit 801 so that the analog voltages generated by the DA converter circuit for subtraction 803 and the DA converter circuit for addition 804 are subtracted. Further, the SAR type AD converter circuit 800 controls the DA converter circuit for addition 804 based on the comparison target bit control signal according to the variation in the output signal OUTN of the comparison circuit 801 so that the analog voltages generated by the DA converter circuit for subtraction 803 and the DA converter circuit for addition 804 are added.

Here, in the SAR type AD converter circuit 800, if the metastable state of the comparator occurs during the comparison determination operation in the comparison circuit 801 and thus the output signals OUTP and OUTN of the comparison circuit 801 both remain unvaried, the analog voltages generated by the DA converter circuit for subtraction 803 and the DA converter circuit for addition 804 are neither subtracted nor added. If the analog voltages generated by the DA converter circuit for subtraction 803 and the DA converter circuit for addition 804 are neither subtracted nor added and then the operation is shifted to the comparison of the next bit according to the externally supplied clock signal CLK, it is not possible to obtain a correct AD conversion result.

Thus, similarly to the previously-described embodiments, when the metastable state of the comparator occurs during the comparison determination operation in the comparison circuit 801 and the output signals OUTP and OUTN of the comparison circuit 801 remain unvaried even after a designed time has elapsed since the comparison determination operation is started, the determination assist circuit varies the values of the signals, thereby varying the output signals OUTP and OUTN of the latch circuit. As a result, in the SAR type AD converter circuit 800, even when the metastable state occurs during the comparison determination operation in the comparison circuit 801, it is possible to obtain a correct AD conversion result.

OTHER EMBODIMENTS

Figure 9:
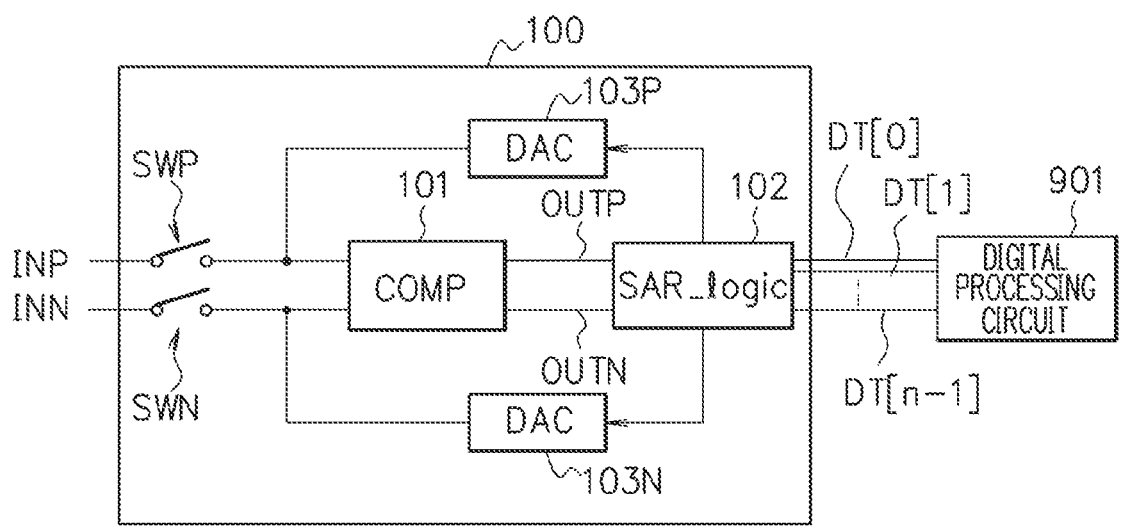
FIG. 9 is a diagram illustrating a configuration example of a semiconductor integrated circuit in this embodiment.
Figure 10A:
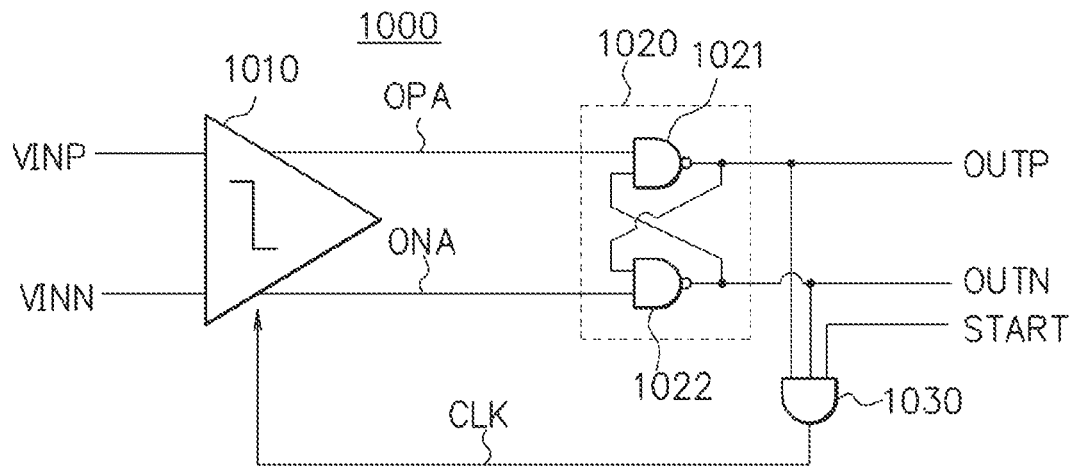
FIG. 10A is a diagram illustrating a configuration example of a comparison circuit included in an analog-to-digital converter circuit.
Figure 10B:
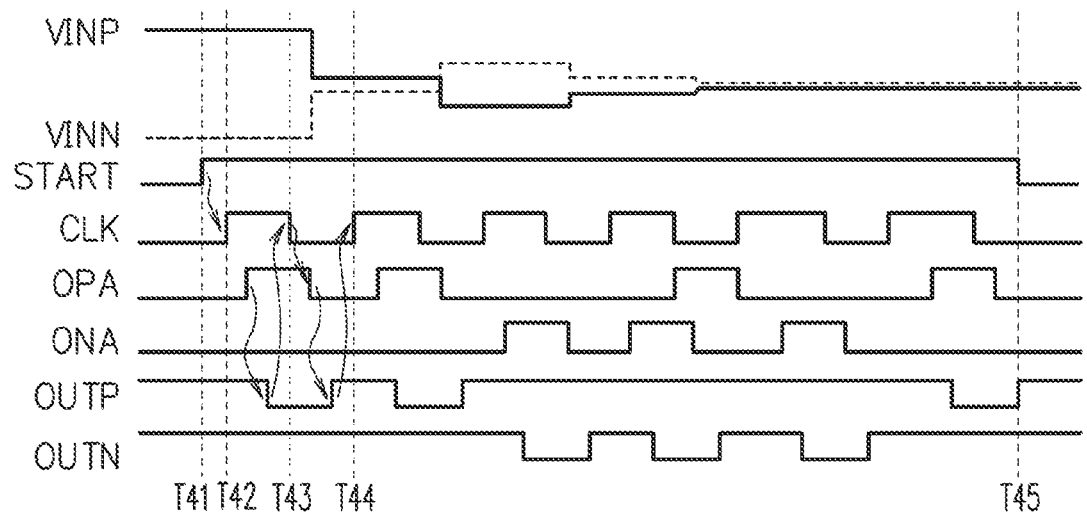
FIG. 10B is a view explaining an example of an operation of the comparison circuit illustrated in FIG. 10A.
Figure 10C:
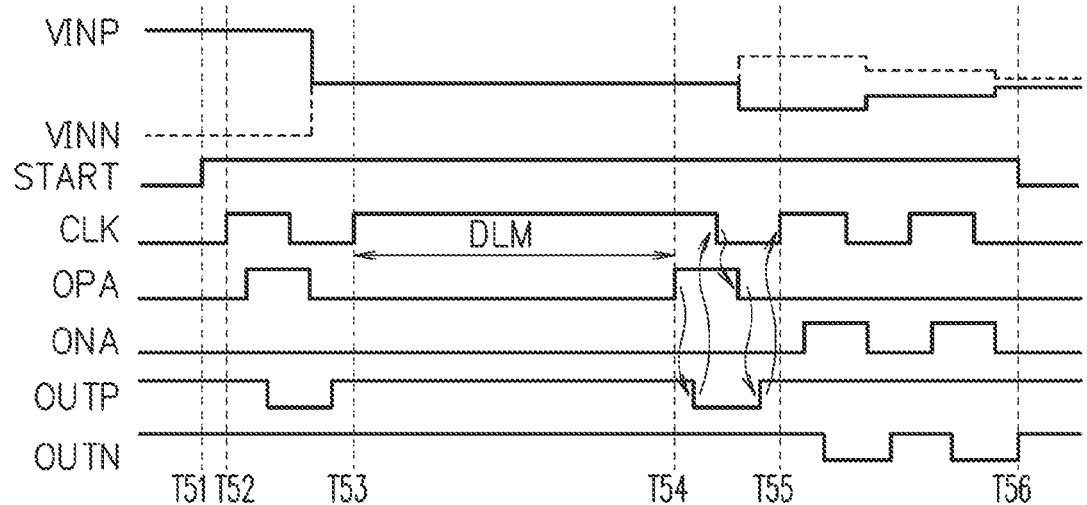
FIG. 10C is a view explaining an example of the operation of the comparison circuit illustrated in FIG. 10A.

FIG. 9 is a diagram illustrating a configuration example of a semiconductor integrated circuit in this embodiment. The semiconductor integrated circuit in this embodiment includes the SAR type AD converter circuit 100 and a digital processing circuit 901. The SAR type AD converter circuit 100 converts analog voltages input to the analog voltage input nodes INP and INN into n-bit digital values and outputs them as digital signals from the output nodes DT[0] to DT[n−1]. The digital processing circuit 901 is a logic circuit or the like that receives the digital signals output from the SAR type AD converter circuit 100 and performs digital signal processing.

The SAR type AD converter circuit 100 includes the switches SWP and SWN, the comparison circuit (COMP) 101, the control circuit (SAR_logic) 102, and the DA converter circuits (DAC) 103P and 103N. The internal circuit configuration and operation of the SAR type AD converter circuit 100 are the same as those of the SAR type AD converter circuit 100 illustrated in FIG. 1.

The digital processing circuit 901 receives the digital signals output from the SAR type AD converter circuit 100 through the output nodes DT[0] to DT[n−1], and performs processing operations and the like on the digital signals.

FIG. 9 illustrates the semiconductor integrated circuit including the SAR type AD converter circuit 100 illustrated in FIG. 1 as an example, but the semiconductor integrated circuit in this embodiment is not limited to this. For example, instead of the SAR type AD converter circuit 100 illustrated in FIG. 1, the SAR type AD converter circuit 800 illustrated in FIG. 8 may be included.

Incidentally, the above-described embodiments merely illustrate one concrete example of implementing the present invention, and the technical scope of the present invention is not to be construed in a restrictive manner by the embodiment. That is, the present invention may be implemented in various forms without departing from the technical spirit or main features thereof.

The disclosed comparison circuit cancels the metastable state by varying the value of the first differential output signal, which indicates the result of the comparison determination, from the reset value, thereby making it possible to complete the AD conversion operation even when the metastable state occurs in the comparison determination operation in the AD converter circuit using the comparison circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A comparison circuit, comprising:
a differential comparison circuit configured to perform comparison determination of differential input signals based on an internal clock signal and generate first differential output signals indicating a result of the comparison determination;
a determination assist circuit configured to receive the first differential output signals output from the differential comparison circuit and generate second differential output signals provided to a latch circuit, the determination assist circuit being configured to vary at least one value of the first differential output signals from a reset value and generate the second differential output signals when a designed time has elapsed with values of the first differential output signals being unvaried from the reset value since the start of an operation of the comparison determination in the differential comparison circuit;
the latch circuit configured to latch the second differential output signals and generate third differential output signals; and
a clock generation circuit configured to generate the internal clock signal based on the third differential output signals.
2. The comparison circuit according to claim 1, wherein the designed time is a time defined as a time sufficient for the differential comparison circuit to complete the operation of the comparison determination.
3. The comparison circuit according to claim 1, wherein the determination assist circuit is configured to be connected between the differential comparison circuit and the latch circuit.

4. The comparison circuit according to claim 1, wherein the determination assist circuit is configured to generate the second differential output signals based on the first differential output signals and the internal clock signal.

5. The comparison circuit according to claim 1, wherein the determination assist circuit is configured to generate the second differential output signals based on the first differential output signals and a delayed internal clock signal obtained by delaying the internal clock signal for the designed time.

6. The comparison circuit according to claim 1, wherein the determination assist circuit includes:
a delay circuit configured to generate a delayed internal clock signal by delaying the internal clock signal;
a first logic circuit configured to receive the delayed internal clock signal and one signal of the first differential output signals and output an operation result as one signal of the second differential output signals; and
a second logic circuit configured to receive the delayed internal clock signal and the other signal of the first differential output signals and output an operation result as the other signal of the second differential output signals.

7. The comparison circuit according to claim 6, wherein the delay circuit is configured to delay the internal clock signal for the designed time.

8. The comparison circuit according to claim 6, wherein the differential comparison circuit is configured to be reset when the internal clock signal is at one logic level of a high level and a low level, and configured to operate to perform comparison determination of the differential input signals when the internal clock signal is at the other logic level, and
the delay circuit is configured to delay the internal clock signal for the designed time and output the delayed internal clock signal when the internal clock signal varies from the one logic level to the other logic level, and configured to delay the internal clock signal for a time shorter than the designed time and output the delayed internal clock signal when the internal clock signal varies from the other logic level to the one logic level.

9. The comparison circuit according to claim 1, wherein the determination assist circuit includes:
a delay circuit configured to generate a delayed internal clock signal by delaying the internal clock signal; and
a first logic circuit configured to receive the delayed internal clock signal and one signal of the first differential output signals and output an operation result as one signal of the second differential output signals.

10. The comparison circuit according to claim 9, wherein the delay circuit is configured to delay the internal clock signal for the designed time.

11. The comparison circuit according to claim 9, wherein the differential comparison circuit is configured to be reset when the internal clock signal is at one logic level of a high level and a low level, and configured to operate to perform comparison determination of the differential input signals when the internal clock signal is at the other logic level, and
the delay circuit is configured to delay the internal clock signal for the designed time and output the delayed internal clock signal when the internal clock signal varies from the one logic level to the other logic level, and configured to delay the internal clock signal for a time shorter than the designed time and output the delayed internal clock signal when the internal clock signal varies from the other logic level to the one logic level.

12. An analog-to-digital converter circuit, comprising:
a digital-to-analog converter circuit configured to generate an analog voltage based on a digital code;
a comparison circuit configured to receive, as differential input signals, comparison analog voltages based on an analog input voltage and the analog voltage generated by the digital-to-analog converter circuit and perform a comparison operation of the differential input signals; and
a control circuit configured to sequentially vary the digital code based on output signals of the comparison circuit and sequentially determine a value of each bit of a digital value obtained by conversion of the analog input voltage, wherein
the comparison circuit includes:
a differential comparison circuit configured to perform comparison determination of the differential input signals based on an internal clock signal and generate first differential output signals indicating a result of the comparison determination;
a determination assist circuit configured to receive the first differential output signals output from the differential comparison circuit and generate second differential output signals provided to a latch circuit, the determination assist circuit being configured to vary at least one value of the first differential output signals from a reset value and generate the second differential output signals when a designed time has elapsed with values of the first differential output signals being unvaried from the reset value and since the start of an operation of the comparison determination in the differential comparison circuit;
the latch circuit configured to latch the second differential output signals and generate third differential output signals; and
a clock generation circuit configured to generate the internal clock signal based on the third differential output signals, and
the third differential output signals generated by the latch circuit are output as the output signals of the comparison circuit.

13. The analog-to-digital converter circuit according to claim 12, wherein
the designed time is a time defined as a time sufficient for the differential comparison circuit to complete the operation of the comparison determination.

14. The analog-to-digital converter circuit according to claim 12, wherein
the determination assist circuit is configured to be connected between the differential comparison circuit and the latch circuit.

15. The analog-to-digital converter circuit according to claim 12, wherein
the determination assist circuit is configured to generate the second differential output signals based on the first differential output signals and the internal clock signal.

16. The analog-to-digital converter circuit according to claim 12, wherein
the determination assist circuit is configured to generate the second differential output signals based on the first differential output signals and a delayed internal clock signal obtained by delaying the internal clock signal for the designed time.

17. An analog-to-digital converter circuit, comprising:
a first digital-to-analog converter circuit and a second digital-to-analog converter circuit configured to generate analog voltages based on a digital code;
a comparison circuit configured to perform a comparison operation of a comparison analog voltage and a reference voltage, the comparison analog voltage being a voltage based on an analog input voltage and the analog voltages generated by the first digital-to-analog converter circuit and the second digital-to-analog converter circuit; and
a control circuit configured to generate a comparison target bit control signal based on output signals of the comparison circuit, the comparison target bit control signal indicating which bit of a plurality of bits of a digital value obtained by conversion of the analog input voltage is currently being compared, wherein
the first digital-to-analog converter circuit is configured to be controlled to subtract the analog voltages generated by the first digital-to-analog converter circuit and the second digital-to-analog converter circuit based on the comparison target bit control signal according to variation of one of the output signals of the comparison circuit, and
the second digital-to-analog converter circuit is configured to be controlled to add the analog voltages generated by the first digital-to-analog converter circuit and the second digital-to-analog converter circuit based on the comparison target bit control signal according to variation of the other of the output signals of the comparison circuit,
the comparison circuit includes:
a differential comparison circuit configured to perform comparison determination of the comparison analog voltage and the reference voltage based on a clock signal and generate first differential output signals indicating a result of the comparison determination;
a determination assist circuit configured to receive the first differential output signals and generate second differential output signals, the determination assist circuit being configured to vary at least one value of the first differential output signals from a reset value and generate the second differential output signals when a designed time has elapsed with values of the first differential output signals being unvaried from the reset value since the start of an operation of the comparison determination in the differential comparison circuit; and
a latch circuit configured to latch the second differential output signals and generate third differential output signals, and
the third differential output signals generated by the latch circuit are output as the output signals of the comparison circuit.

18. A semiconductor integrated circuit, comprising:
the analog-to-digital converter circuit according to claim 12; and
a digital processing circuit configured to receive a digital signal output from the analog-to-digital converter circuit and perform a processing operation.

19. A semiconductor integrated circuit, comprising:
the analog-to-digital converter circuit according to claim 17; and
a digital processing circuit configured to receive a digital signal output from the analog-to-digital converter circuit and perform a processing operation.

* * * * *